United States Patent
McNeil (10) Patent No.: US 10,712,359 B2
(45) Date of Patent: Jul. 14, 2020

(54) FLEXURE WITH ENHANCED TORSIONAL STIFFNESS AND MEMS DEVICE INCORPORATING SAME

(71) Applicant: NXP USA, Inc., Austin, TX (US)

(72) Inventor: Andrew C. McNeil, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 150 days.

(21) Appl. No.: 15/967,723

(22) Filed: May 1, 2018

(65) Prior Publication Data

US 2019/0339301 A1    Nov. 7, 2019

(51) Int. Cl.
   *G01P 15/125*   (2006.01)
   *G01P 15/18*    (2013.01)
   *G01P 15/08*    (2006.01)

(52) U.S. Cl.
   CPC ............ *G01P 15/125* (2013.01); *G01P 15/18* (2013.01); *G01P 2015/0857* (2013.01); *G01P 2015/0862* (2013.01)

(58) Field of Classification Search
   CPC .................. G01P 15/125; G01P 15/18; G01P 2015/0857; G01P 2015/0862; G01P 2015/0865; G01P 2015/0868; G01P 2015/0871; G01P 2015/0874; G01P 2015/0877; G01P 2015/0882; G01C 19/5719; G01C 19/5733; G01C 19/5747; G01C 19/5755; G01C 19/5762; G01C 19/5621; G01C 19/5656; G01C 19/5712
   USPC ... 73/514.32, 31.06, 61.49, 861.34–861.357, 73/504.02, 504.03, 504.04, 504.15, 73/504.16, 514.01, 514.02, 514.15,
   (Continued)

(56) References Cited

U.S. PATENT DOCUMENTS

| | | |
|---|---|---|
| 6,105,428 A | 8/2000 | Schmiesing et al. |
| 6,845,670 B1 | 1/2005 | McNeil et al. |
| 8,413,509 B2 | 4/2013 | Geisberger |

(Continued)

FOREIGN PATENT DOCUMENTS

| | | |
|---|---|---|
| DE | 102009000729 A1 | 8/2010 |
| DE | 102016203092 A1 | 5/2017 |

OTHER PUBLICATIONS

U.S. Appl. No. 15/967,800, not yet published; 25 pages (May 1, 2018).

(Continued)

*Primary Examiner* — Robert R Raevis
(74) *Attorney, Agent, or Firm* — Charlene R. Jacobsen (57) ABSTRACT

A flexure for a MEMS device includes an elongated beam and a protrusion element extending outwardly from a sidewall of the elongated beam. A MEMS inertial sensor includes a movable element spaced apart from a surface of a substrate, an anchor attached to the substrate, and a spring system. The spring system includes first and second beams, a center flexure between the first and second beams, a first end flexure interconnected between an end of the first beam and the anchor, and a second end flexure interconnected between an end of the second beam and the movable element. Each of the end flexures includes the elongated beam having first and second ends, and the sidewall defining a longitudinal dimension of the elongated beam, and the protrusion element extending from the sidewall of the elongated beam, the protrusion element being displaced away from the first and second ends of the beam.

18 Claims, 7 Drawing Sheets

(58) Field of Classification Search
USPC .............. 73/514.23, 514.24, 514.29, 514.35, 73/514.38
See application file for complete search history.

(56) References Cited

U.S. PATENT DOCUMENTS

| | | | |
|---|---|---|---|
| 9,360,496 B2 | 6/2016 | Naumann | |
| 2002/0118911 A1* | 8/2002 | Bourgeois | G02B 6/3566 385/19 |
| 2004/0187592 A1 | 9/2004 | Sugiura | |
| 2008/0196502 A1 | 8/2008 | Fukuda et al. | |
| 2012/0018624 A1* | 1/2012 | Baba | G02B 6/4201 250/214.1 |
| 2013/0180332 A1 | 7/2013 | Jia et al. | |
| 2015/0239731 A1* | 8/2015 | Ahtee | B81B 3/0051 257/415 |
| 2016/0131552 A1 | 5/2016 | Naumann | |
| 2016/0264401 A1* | 9/2016 | Liukku | B81B 3/0056 |
| 2018/0180419 A1 | 6/2018 | Geisberger | |

OTHER PUBLICATIONS

Non Final Office Action; U.S. Appl. No. 15/967,800; 6 pages (dated Apr. 1, 2020).

* cited by examiner

FIG. 1

PRIOR ART

FIG. 2

PRIOR ART

FIG. 3

PRIOR ART

FIG. 14

FLEXURE WITH ENHANCED TORSIONAL STIFFNESS AND MEMS DEVICE INCORPORATING SAME

TECHNICAL FIELD OF THE INVENTION

The present invention relates generally to microelectromechanical systems (MEMS) devices. More specifically, the present invention relates to a three-axis MEMS accelerometer having a single proof mass.

BACKGROUND OF THE INVENTION

Microelectromechanical systems (MEMS) technology provides a way to make very small mechanical structures and integrate these structures with electrical devices on a single substrate using conventional batch semiconductor processing techniques. One common application of MEMS is the design and manufacture of sensor devices. MEMS sensors are widely used in applications such as automotive, inertial guidance systems, household appliances, game devices, protection systems for a variety of devices, and many other industrial, scientific, and engineering systems.

One example of a MEMS inertial sensor is a MEMS accelerometer. MEMS accelerometers are sensitive to acceleration and may be configured to sense acceleration forces along one, two, or three axes or directions. One common form of MEMS accelerometer uses one or more movable structures that move under acceleration above a substrate. The movement of the movable structure changes capacitance, and an electrical circuit connected to the MEMS accelerometer structure measures the change in capacitance to determine the acceleration forces.

In order to sense motion along multiple axes, MEMS accelerometers may include multiple movable structures that move independently of one another in response to accelerations. As these devices continue to shrink in size, it becomes desirable to reduce the collective size of these movable structures. But reducing the collective size of the movable structures can make it increasingly difficult to meet predetermined sensitivity, linearity, and reliability requirements. In addition, due to smaller sizes and travel distances of the movable structures, some MEMS accelerometers may have insufficient restoring force and can therefore be vulnerable to damage from high impact loads.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns a flexure with enhanced torsional stiffness and a microelectromechanical systems (MEMS) device incorporating one or more of the flexures. The flexure includes a design feature that effectively alters the stiffness of the narrow MEMS flexure in a useful manner, thereby increasing torsional stiffness. In some embodiments, the MEMS device incorporating such a flexure having the design feature can include inertial sensors, such as MEMS accelerometers. The MEMS accelerometer devices may be capable of sensing acceleration in three orthogonal directions (e.g., X-direction, Y-direction, and Z-direction) defined by three orthogonal axes (e.g., X-axis, Y-axis, and Z-axis). A relatively small device size may be provided by facilitating the sharing of a single proof mass for sensing in all three directions. Further, some embodiments can provide this relatively small device size while still yielding improvements in linearity and restoring force when subjected to high impact loads. These improvements can be provided by the use of spring systems having useful spring constants in each of three orthogonal directions with flexures having a design feature that enhances torsional stiffness.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
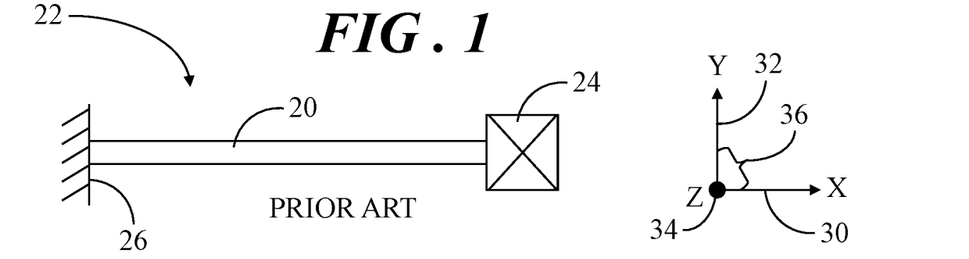
FIG. 1 shows a top view of a prior art flexure for a microelectromechanical systems (MEMS) device.

Referring to FIG. 1, FIG. 1 shows a top view of a prior art flexure 20 for a microelectromechanical systems (MEMS) device, generally represented by the reference numeral 22. One or more flexures, such as flexure 20, may be suspended above a substrate (not shown) and may be interconnected between one or more anchors 24 coupled to the substrate and a movable element, sometimes referred to as a proof mass 26 (only a portion of which is shown). Thus, one or more flexures 20 (sometimes referred to as springs) may be configured to movably couple proof mass 26 to the surface of the substrate. In the top view illustration of FIG. 1, a three-dimensional coordinate system is represented in which an X-axis 30 is directed rightward and leftward on the page, a Y-axis 32 is directed upward and downward on the page, and a Z-axis 34 is directed into the page. Together, X-axis 30 and Y-axis 32 define an X-Y plane 36, and the surface of the substrate is generally parallel to X-Y plane 36.

Figure 2:
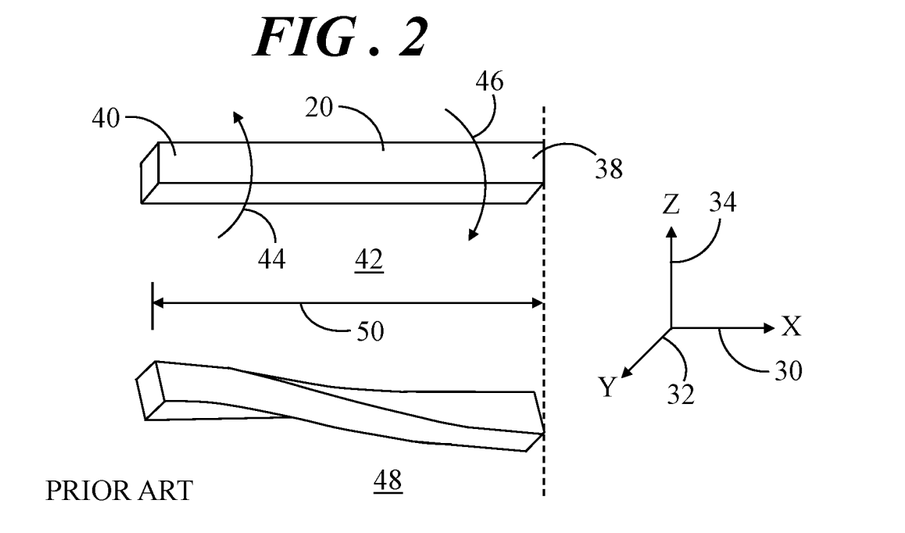
FIG. 2 shows simplified perspective views of the prior art flexure demonstrating axial torsional rotation.

FIG. 2 shows simplified perspective views of the prior art flexure 20 demonstrating axial torsion. A first end 38 of flexure 20 may be coupled to anchor 24 (FIG. 1) and a second end 40 of flexure 20 may be coupled to the movable proof mass 26 (FIG. 1). A first representative model 42 shows oppositely directed arrows 44, 46 demonstrating the opposing forces that flexure 20 may be subjected to in response to motion of proof mass 26 relative to anchor 24 that could result in the axial torsion. A second representative model 48 shows (in an exaggerated form) the axial torsion (twisting) of flexure 20 relative to X-axis 30. A length 50 of flexure 20 can affect the torsional stiffness of flexure 20 in the X-direction such that a greater length 50, increases the potential for twisting of flexure 20 in response to force.

Figure 3:
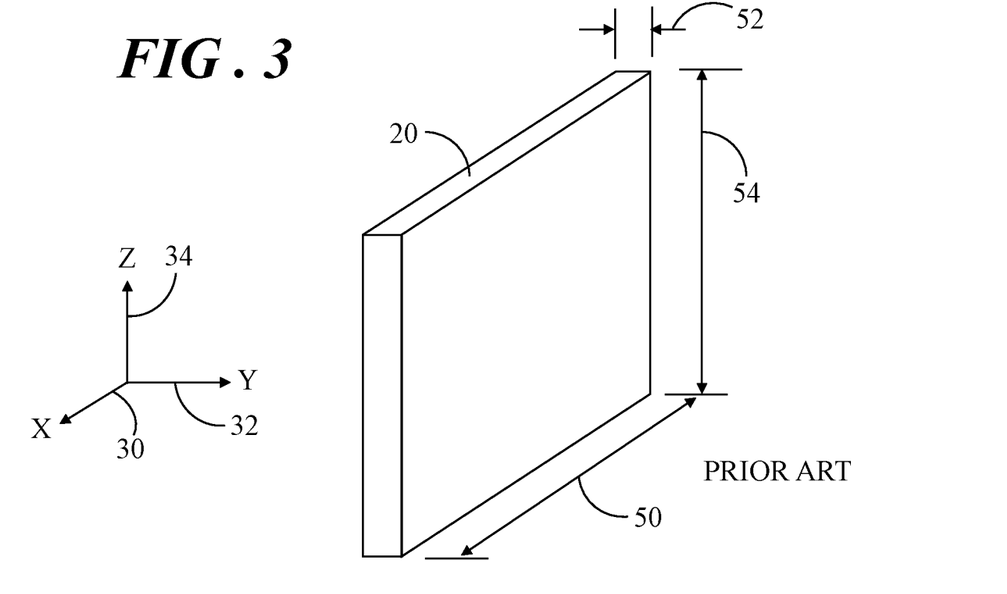
FIG. 3 shows a simplified perspective view of the prior art flexure.

FIG. 3 shows a simplified perspective view of prior art flexure 20. Flexure 20 is a three-dimensional structure having length 50, a width 52, and a thickness 54, and a typical configuration for flexure 20 is a narrow, rectangular beam. The behavior of flexure 20 can be represented using six stiffness terms, referred to as spring constants. There are three translational spring constants ($K_{TX}$, $K_{TY}$, $K_{TZ}$) relative to X-, Y-, and Z-axes 30, 32, 34 that describe force versus translation parallel to the associated X-, Y-, and Z-axes 30, 32, 34. Additionally, there are three rotational spring constants ($K_{RX}$, $K_{RY}$, $K_{RZ}$) relative to X-, Y-, and Z-axes 30, 32, 34 that describe force versus rotation (also referred to as torsion) about the associated X-, Y-, and Z-axes 30, 32, 34. It may be desirable to independently adjust at least some of these spring constants to meet certain design requirements.

Length 50 of flexure 20 affects the spring constants. Consider an example in which thickness 54 of flexure 20 is considerably greater than width 52 of flexure 20 (e.g., thickness 54 of 25 microns versus width 52 of 2 microns). For an almost infinitely long length 50 of flexure 20, the rotational spring constants $K_{RX}$ and $K_{RZ}$ scale in a similar fashion relative to width 52 and thickness 54, as follows:

$$K_{RZ}, K_{RX} \propto \frac{tw^3}{L_f} \quad (1)$$

In equation (1), t represents thickness 54, w represents width 52, and $L_f$ represents length 50 of flexure 20. For very long beams, the rotational spring constants $K_{RX}$ and $K_{RZ}$ scale together so they cannot be independently adjusted.

For flexures 20 of finite length 50, an axial rotational spring constant, $K_{RX}$ (e.g., characterizing the rotational stiffness about X-axis 30), does not scale directly with an inverse length 38. That is, regions near the first and second ends 38, 40 attached to beam 24 and proof mass 26, respectively of flexure 20 cannot deform as readily as the intervening regions. Thus, length 50 can be adjusted by a change in length, $\Delta L$. The change in length, $\Delta L$, represents an effective loss of length 50 from end effects (e.g., the attachment of flexure 20 to anchor 24 and/or to proof mass 26). Accordingly, the axial rotational spring constant, $K_{RX}$, can more suitably be represented by equation (2), as follows:

$$K_{RX} \propto \frac{tw^3}{L_f - \Delta L} \quad (2)$$

An in-plane rotational spring constant, $K_{RZ}$ (e.g., characterizing the rotational stiffness about z-axis 34), is not affected as much by the end effects of flexure 20. Thus, the in-plane rotational spring constant, $K_{RZ}$, can still be represented by equation (1). In accordance with embodiments discussed below, the ratio for axial rotational stiffness, $K_{RX}$, can be modified by incorporating a design feature with the elongated beam flexures to effectively yield a flexure having a series of short lengths. These design features effectively break up a flexure into a series of shorter lengths to produce periodic end effects or end conditions, thereby imitating attachment to another structure, so that axial rotational stiffness, $K_{RX}$, can be adjusted independent from the in-plane rotational spring constant, $K_{RZ}$.

Figure 4:
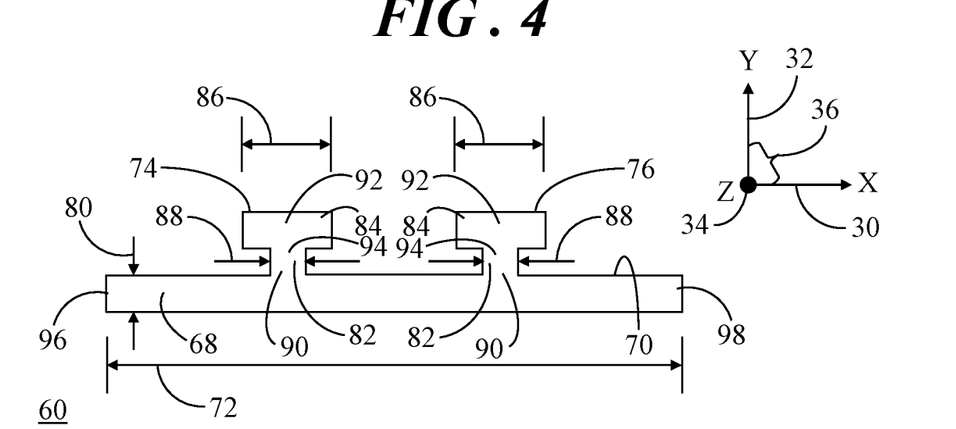
FIG. 4 shows a top view of a flexure for a MEMS device in accordance with an embodiment.
Figure 5:
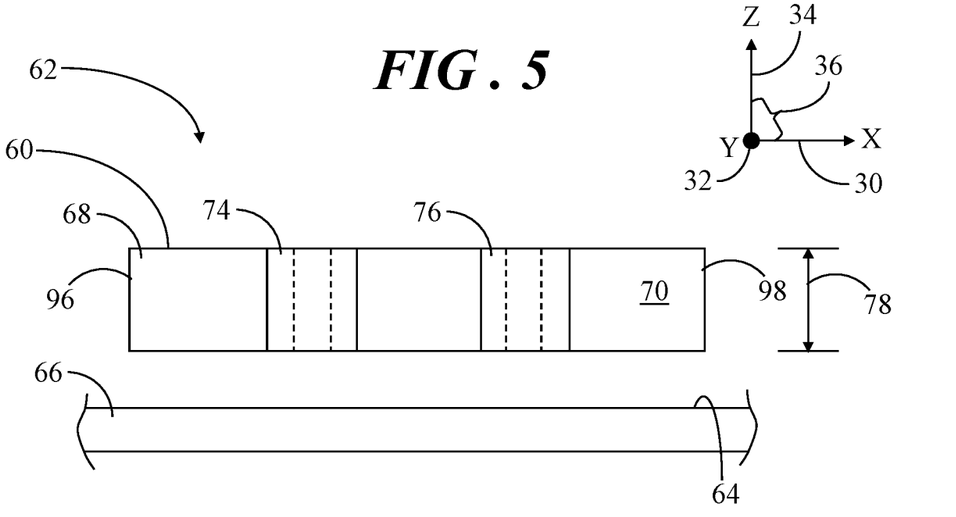
FIG. 5 shows a partial side view of a MEMS device including the flexure of FIG. 4.
Figure 6:
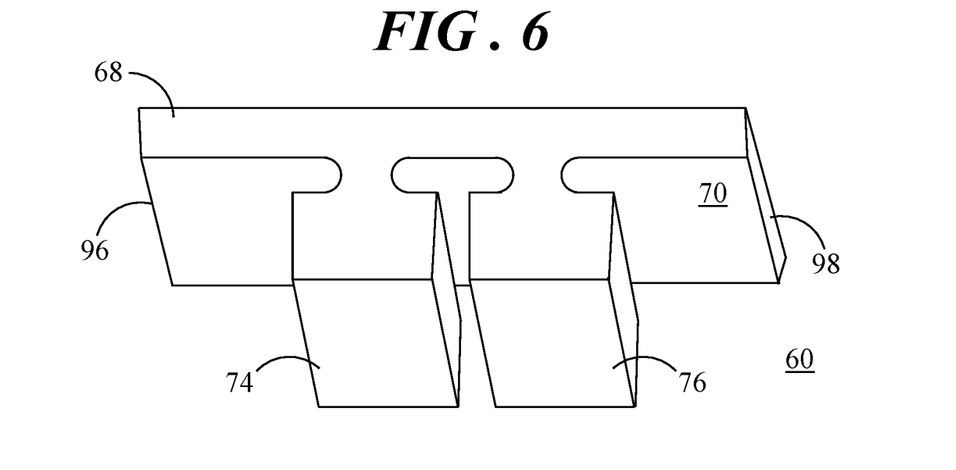
FIG. 6 shows a perspective view of the flexure of FIG. 4.

Referring now to FIGS. 4-6, FIG. 4 shows a top view of a flexure 60 for a MEMS device in accordance with an embodiment, FIG. 5 shows a partial side view of a MEMS device 62 including flexure 60, and FIG. 6 shows a perspective view of flexure 60. In MEMS device 62, flexure 60 is configured to be spaced apart from a surface 64 of a substrate 66. Flexure 60 includes an elongated beam 68 having a sidewall 70 defining a longitudinal dimension (e.g., a length 72) of elongated beam 68. In this example, length 72 of elongated beam is parallel to X-axis 30. Protrusion elements 74, 76 extend outwardly from sidewall 70 of elongated beam 68.

Each of protrusion elements 74, 76 is a cantilevered arrangement that is coupled at one end to sidewall 70 of elongated beam 68 and extends substantially parallel to surface 64 of substrate 66. Additionally, elongated beam 68 and protrusion elements 74, 76 exhibit a thickness 78 perpendicular to surface 64 of substrate 66. Elongated beam 68 further exhibits a beam width 80. In this example, thickness 78 of elongated beam 68 and protrusion elements 74, 76 is parallel to Z-axis 34, and beam width 80 is parallel to Y-axis 32. Thus, beam width 80 is orthogonal to length 72 and to thickness 78 within the provided three-dimensional coordinate system. Each of protrusion elements 74, 76 may be a generally T-shaped structure (as viewed from the top as shown in FIG. 4) having a base 82 and a crossmember 84 in which crossmember 84 has a length 86 that is greater than a width 88 of base 82. Base 82 has a first end 90 coupled to sidewall 70 of elongated beam 68. A central portion 92 of crossmember 84 is coupled to a second end 94 of base 82.

In some embodiments, beam width 80 is less than each of length 72 and thickness 78. Therefore, elongated beam 68 could be subject to axial torsion about X-axis 30 as demonstrated in FIG. 2. Protrusion elements 74, 76 are positioned along sidewall 70 displaced away from first and second ends 96, 98 of elongated beam 68. Protrusion elements 74, 76 function to effectively break length 72 of elongated beam 68 into a series of shorter lengths by adding periodic end conditions. That is, the presence of protrusion elements 74, 76 imitates the end effects caused by, for example, the interconnection of flexure 60 to each of a fixed anchor and a movable proof mass, as discussed above. Thus, the shape and quantity of protrusions 74, 76 can be used to effectively adjust the axial rotational stiffness, $K_{RX}$, independent from the in-plane rotational stiffness, $K_{RZ}$. In some embodiments, the rotational spring constant, $K_{RX}$, may be increased by the presence of protrusion elements 74, 76 to substantially limit axial torsion.

The embodiment shown in FIGS. 4-6 includes two protrusion elements 74, 76 displaced away from first and second ends 96, 98 of elongated beam 68 and likewise laterally displaced away from one another. Alternative embodiments, may include a single protrusion element or more than two protrusion elements extending from a sidewall of an elongated beam. In a configuration that includes three or more protrusion elements, the protrusion elements may be displaced an equal distance from one another or at differing distances from one another in accordance with a particular design configuration. And still other alternative embodiments, may include protrusion elements extending from opposing sidewalls of an elongated beam.

Figure 7:
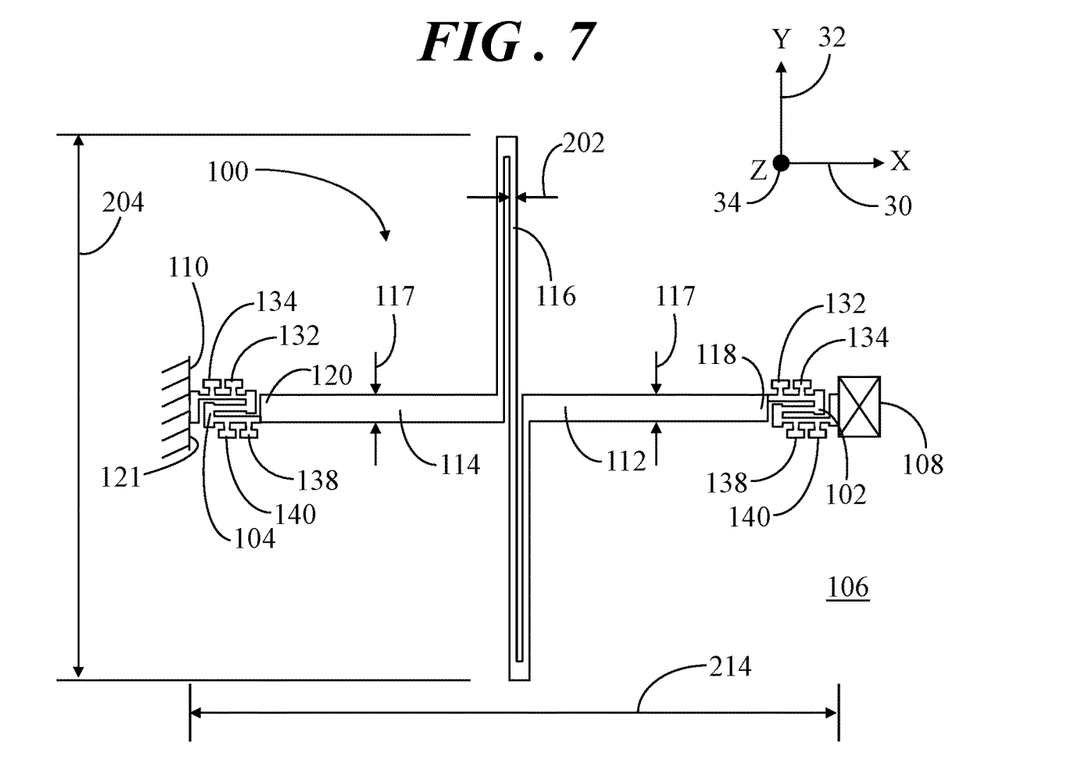
FIG. 7 shows a top view of a spring system that includes flexures in accordance with another embodiment that may be implemented within a MEMS inertial sensor.

FIG. 7 shows a top view of a spring system 100 that includes flexures 102, 104 that may be implemented within a MEMS inertial sensor 106 in accordance with an embodiment. MEMS inertial sensor 106 is represented in FIG. 7 by an anchor 108 and portion of a movable element, referred to therein as a proof mass 110. A more extensive description of MEMS inertial sensor 106 will be provided below in connection with FIGS. 9 and 10.

Spring system 100 includes a first beam 112, a second beam 114, a first center flexure 116, flexure 102, and flexure 104. First center flexure 116 is interposed between and connected to each of first and second beams 112, 114. First and second beams 112, 114 of spring system 100 are generally resistant to deformation relative to first center flexure 116 and relative to flexures 102, 104 due at least in part to their relatively large beam width 117. Flexure 102 of spring system 100 is interconnected between a first beam end 118 of first beam 112, and is thus referred to herein as a first end flexure 102. Flexure 104 is interconnected between a second beam end 120 of second beam 114 and a first edge 121 of proof mass 110, and is thus referred to herein as a second end flexure 104.

Figure 8:
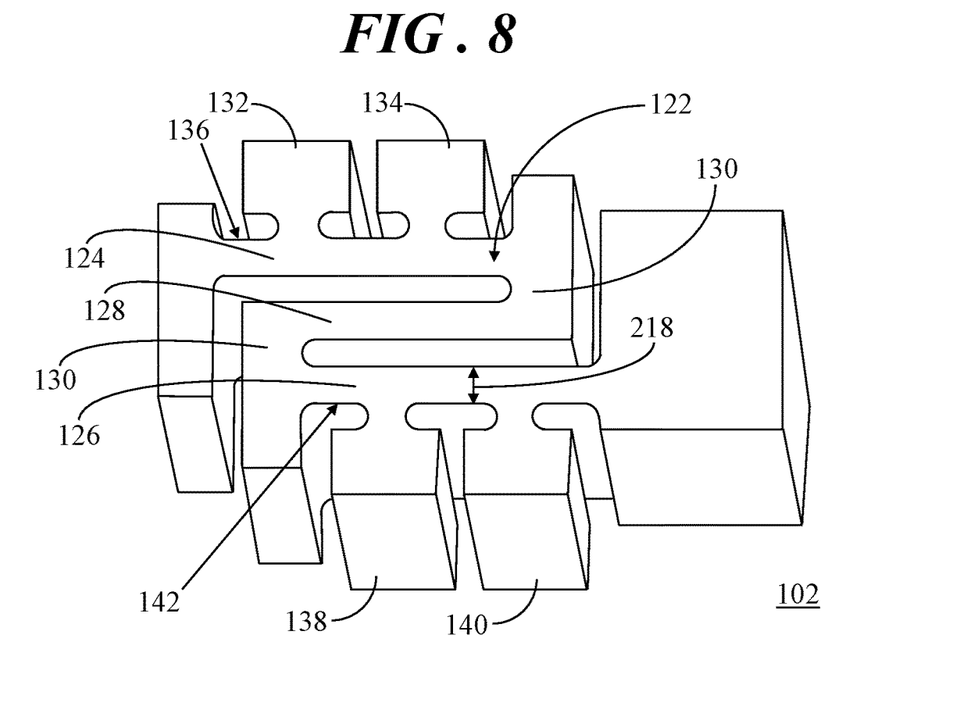
FIG. 8 shows an enlarged perspective view of one of the flexures of the spring system of FIG. 7.

Referring concurrently to FIGS. 7-8, FIG. 8 shows an enlarged perspective view of first end flexure 102 of spring system 100. Although first end flexure 102 is described in detail, the following applies equivalently to second end flexure 104. First end flexure 102 includes an elongated beam 122 in the form of a serpentine flexure having a first beam segment 124, a second beam segment 126, and at least one intervening beam segment 128 (one shown) located between the first and second beam segments 124, 126. The first beam segment 124, intervening beam segment 128, and second beam segment 126 are interconnected via connectors 130 to form elongated beam 122 in the form of a serpentine flexure (also referred to as a meander spring or a folded beam spring). The serpentine flexure may provide the desired spring constants while concurrently achieving space savings within a MEMS device, such as MEMS inertial sensor 106.

First and second protrusion elements 132, 134 extend from a first sidewall 136 of flexure 102. More particularly, first and second protrusion elements 132, 134 extend from first sidewall 136 of first beam segment 124. Third and fourth protrusion elements 138, 140 extend from a second sidewall 142 of second beam segment 122. It can be observed that if the serpentine flexure was straightened, first and second sidewalls 136, 142 would be opposing longitudinal sides of elongated beam 122, and thereby define a longitudinal dimension of elongated beam 122. In operation, the presence of protrusion elements 132, 134, 138, 140 can effectively increase the torsional spring constant, $K_{RX}$, of first end flexure 102 implemented within MEMS inertial sensor 106, relative to a device that does not include protrusion elements 132, 134, 138, 140.

Figure 9:
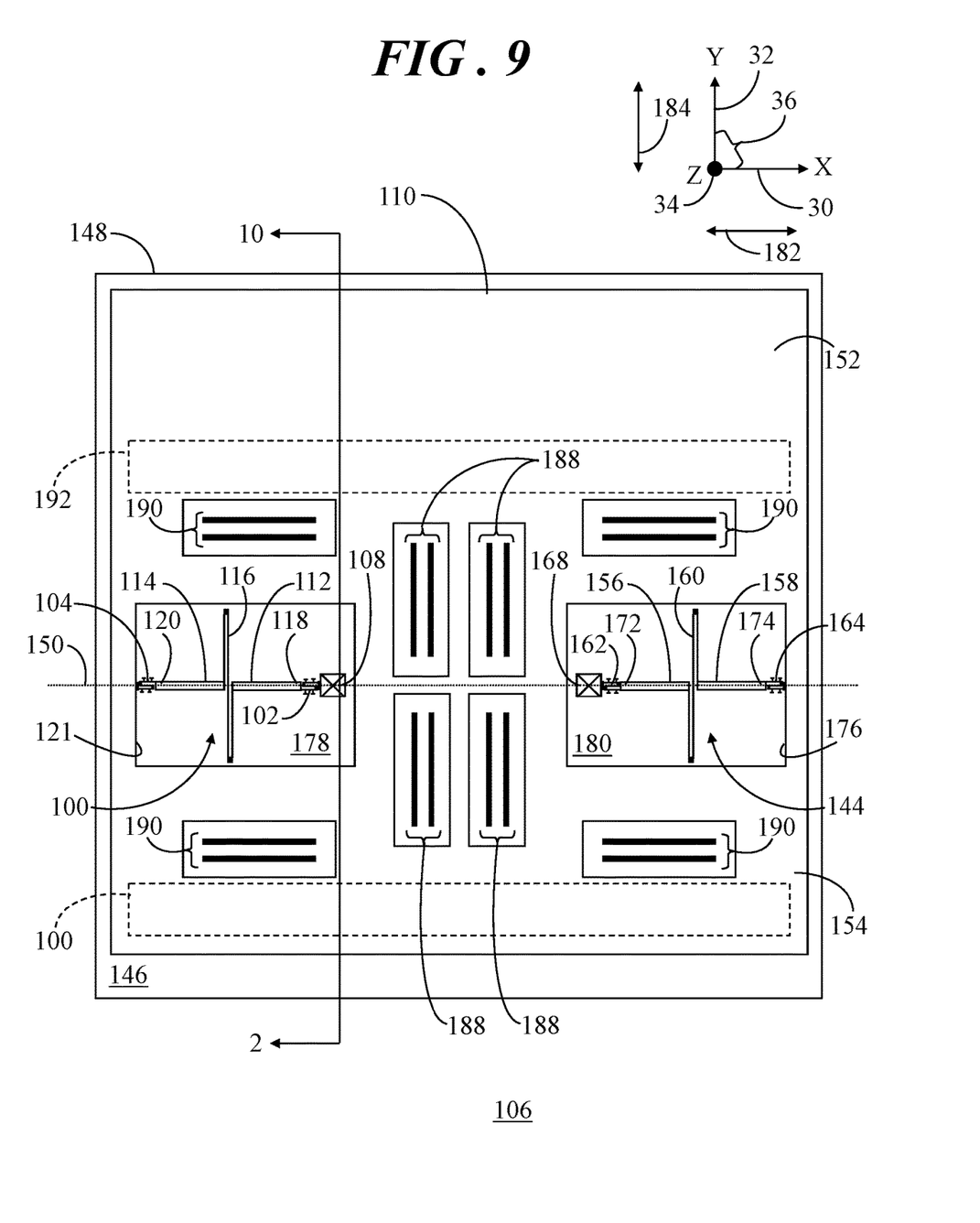
FIG. 9 shows a schematic top view of a microelectromechanical systems (MEMS) inertial sensor in accordance with an exemplary embodiment.
Figure 10:
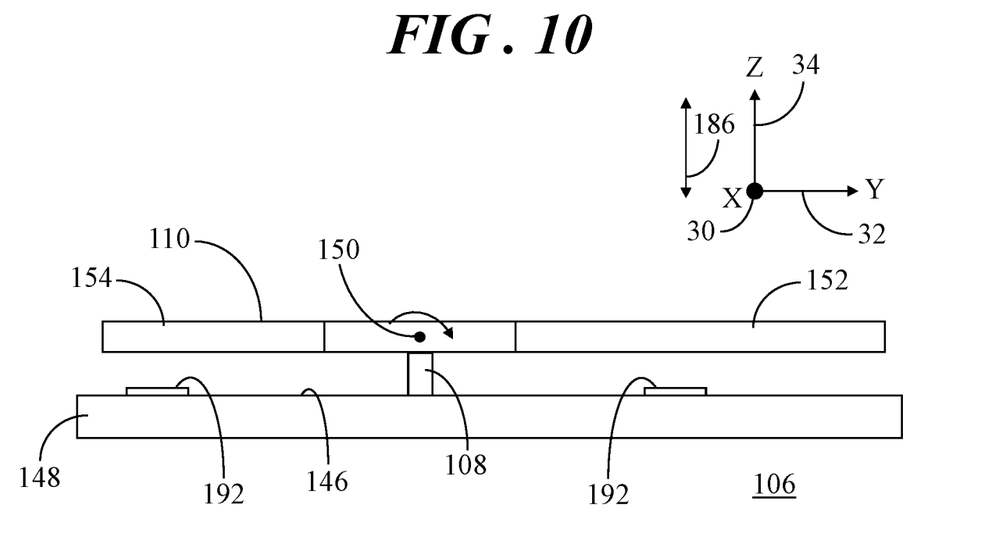
FIG. 10 shows a cross-sectional side view of the MEMS inertial sensor along section lines 10-10 of FIG. 9.

Referring to FIGS. 9 and 10, FIG. 9 shows a schematic top view of MEMS inertial sensor 106 in accordance with an exemplary embodiment and FIG. 10 shows a cross-sectional side view of MEMS inertial sensor 106 along section lines 10-10 of FIG. 9. MEMS inertial sensor 106 generally includes proof mass 110, first spring system 100, and a second spring system 144 spaced apart from proof mass 110. First and second spring systems 100, 144 are configured to movably couple proof mass 110 to a surface 146 of a substrate 148. Like first spring system 100, second spring system 144 includes protrusion elements 132, 134, 138, 140 as discussed in connection with FIGS. 7 and 8. MEMS inertial sensor 106 is described herein to provide an example embodiment in which protrusion elements may be implemented to adjust the axial torsional stiffness of a flexure. Other flexure configurations implemented within other MEMS devices may also incorporate the protrusion elements in order to adjust the axial torsional stiffness of such a flexure in accordance with particular design requirements.

As will be discussed in significantly greater detail below, first and second spring systems 100, 144 enable translational motion of proof mass 110 in response to acceleration forces in directions that are substantially parallel to either of X-axis 30 and Y-axis 32. Additionally, proof mass 110 has asymmetric mass relative to a rotational axis 150. That is, a first portion 152 and a second portion 154 of proof mass 110 are disposed on opposing sides of rotational axis 150. In the illustrated embodiment, first portion 152 of proof mass 110 has greater mass than second portion 154. This can be accomplished, in some embodiments, by offsetting rotational axis 150 away from a geometric center of proof mass 110. Accordingly, first and second spring systems 100, 144 further enable rotational motion of proof mass 110 about rotational axis 150 in response to acceleration force in a direction that is substantially parallel to Z-axis 34.

As described above, first spring system 100 includes first beam 112, second beam 114, first center flexure 116, first end flexure 102, and second end flexure 104. Likewise, second spring system 144 includes a third beam 156, a fourth beam 158, a second center flexure 160, a third end flexure 162, and a fourth end flexure 164. Third and fourth beams 156, 158 of second spring system 144 are also resistant to deformation relative to second center flexure 160 and relative to third and fourth end flexures 162, 164. Of particular note herein, third and fourth end flexures 162, 164 also include protrusion elements. Reference numerals are not provided in FIG. 9 for clarity of illustration. However, it should be understood that the protrusion elements included on third and fourth end flexures 162, 164 correspond to protrusion elements 132, 134, 138, 140 described in detail above in connection with FIGS. 7 and 8. Hence, further description of the protrusion elements is omitted herein for brevity. The terms "first," "second," "third," "fourth," and so on used herein do not refer to a sequential ordering or prioritization of the elements of MEMS inertial sensor 106. Instead, the terms "first," "second," "third," "fourth," and so on are used to distinguish the various elements from one another for clarity of description.

Inertial sensor 106 further comprises first and second anchors 108, 168, respectively, attached to substrate 148. More particularly, first and second anchor 108, 168 are coupled to substrate 148 at rotational axis 150 for proof mass 110. First end flexure 102 of first spring system 100 is interconnected between first beam end 118 of first beam 112 and first anchor 108, and second end flexure 104 is interconnected between second beam end 120 of second beam 114 and first edge 121 of proof mass 110. Additionally, third end flexure 162 of second spring system 144 is interconnected between a third beam end 172 of third beam 156 and second anchor 168, and fourth end flexure 164 is interconnected between a fourth beam end 174 of fourth beam 158 and a second edge 176 of proof mass 110.

In the illustrated configuration, a first opening 178 extends through proof mass 110 in which first spring system 100 is located and a second opening 180 extends through proof mass 110 in which second spring system 144 is located. Thus, first edge 121 of proof mass 110 is at a perimeter of first opening 178 and second edge 176 of proof mass 110 is at a perimeter of second opening 180. In addition, first and second spring systems 100, 144 may be oriented in mirror symmetry relative to one another within the respective first and second openings 178, 180 of proof mass 110. Further, first and second spring systems 100, 144 may be laterally disposed on opposing sides of a midline of proof mass 110 (in which the midline is parallel to Y-axis 32) by an equivalent distance. Still further, first and second beams 112, 114 of first spring system 100 and third and fourth beams 156, 158 of second spring system 144 are located at rotational axis 150 with a longitudinal dimension of each of beams 112, 114, 156, 158 being aligned with rotational axis 150, and therefore parallel to X-axis 30.

As will be discussed in greater detail below, first and second spring systems 100, 144 facilitate translational motion of proof mass 110. This translational motion includes motion in a first direction, referred to herein as an X-direction 182 parallel to X-axis 30 and motion in a second direction, referred to herein as a Y-direction 184 parallel to Y-axis 32. This translational motion of proof mass 110 is used to detect acceleration in the corresponding X-direction 182 and Y-direction 184 substantially parallel to surface 146 of substrate 148. First and second spring systems 100, 144 additionally facilitate teeter-totter like rotation of proof mass 110 about rotational axis 150. The asymmetric mass and rotation about rotational axis 150 enables proof mass 110 to detect acceleration in a third direction, referred to herein as a Z-direction 186 parallel to Z-axis 34 and orthogonal to surface 146 of substrate 148. In accordance with embodiments herein the inclusion of protrusion elements 132, 134, 138, 140, (FIG. 8) effectively adjust the axial rotational spring constant, $K_{RX}$, of first, second, third, and fourth end flexures 102, 104, 162, 164 to enable a suitably rotational stiffness for the teeter-totter motion of proof mass 110 about rotational axis 150.

MEMS inertial sensor 106 further includes first electrodes 188, second electrodes 190, and third electrodes 192. As mentioned previously, MEMS device 106 is configured to determine the force applied by acceleration in any of three orthogonal directions (i.e., X-direction 182, Y-direction 184, and Z-direction 186 as defined by the corresponding X-axis 30, Y-axis 32, and Z-axis 34). First and second electrodes 188, 190, respectively, are coupled to surface 146 of substrate 148 and can be disposed in openings extending through proof mass 110. First electrodes 188 are used to detect acceleration in X-direction 182 as a change in capacitance between first electrodes 188 and proof mass 110. Similarly, second electrodes 190 are used to detect acceleration in Y-direction 184 as a change in capacitance between second electrodes 190 and proof mass 110. Third electrodes 192 are formed on surface 146 of substrate 148 underlying proof mass 110 on opposing sides of rotational axis 150. Third electrodes 192 are used to detect acceleration in Z-direction 186 as a change in capacitance between third electrodes 192 and proof mass 110.

Figure 11:
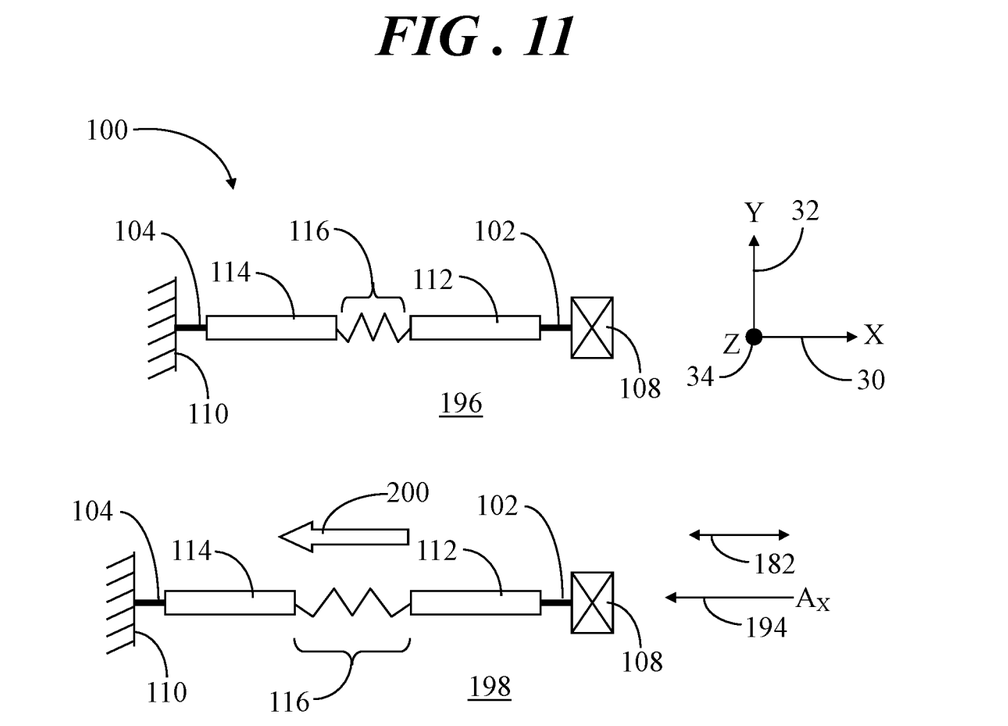
FIG. 11 shows a representative top view of the spring system of FIG. 7 in response to an acceleration force in a first direction.

FIG. 11 shows a representative top view of first spring system 100 in response to a first acceleration force 194, labeled $A_X$, in X-direction 182. The following discussion applies equivalently to second spring system 144 (FIG. 9). FIG. 11 shows a first representative model 196 of first spring system 100 that is not being subjected to first acceleration force 194 and a second representative model 198 of first spring system 100 being subjected to first acceleration force 194 in X-direction 182. In the images of FIG. 11, first and second end flexures 102, 104 (FIG. 7) are represented by simple beam models and first center flexure 116 is represented by a simple tension/expansion spring model.

First spring system 100 is configured to facilitate translational motion, represented by an arrow 200, of proof mass 110 relative to first anchor 108 and substantially parallel to surface 146 (FIG. 9) of substrate 148 (FIG. 9) in order to sense first acceleration force 194 in X-direction 182. A first beam width 202 (see FIG. 7) and a spring length 204 (see FIG. 7) of first center flexure 116 can provide suitable flexibility for translational motion 200 in response to first acceleration force 194 in X-direction 182. This translational motion is therefore referred to hereinafter as X-axis translational motion 200. As shown in second representative model 198, first center flexure 116 is flexible in X-direction 182 to enable X-axis translational motion 200 of proof mass 110 in X-direction 182 in response to first acceleration force 194. However, first and second beams 112, 114 and first and second end flexures 102, 104 are stiff in X-direction 182 relative to first center flexure 116. Thus, nearly all compliance in X-direction 182 is provided by first center flexure 116. In one example, first beam width 202 may be approximately 2 microns and spring length 204 may be approximately 150 microns to yield an 8 N/m (Newton per meter) translational spring constant, $KT_X$, of first center flexure 116. However, alternative embodiments may implement different beam widths 202 and spring lengths 204 and more or less folds of the folded beam structure to yield the desired compliance in X-direction 182.

Figure 12:
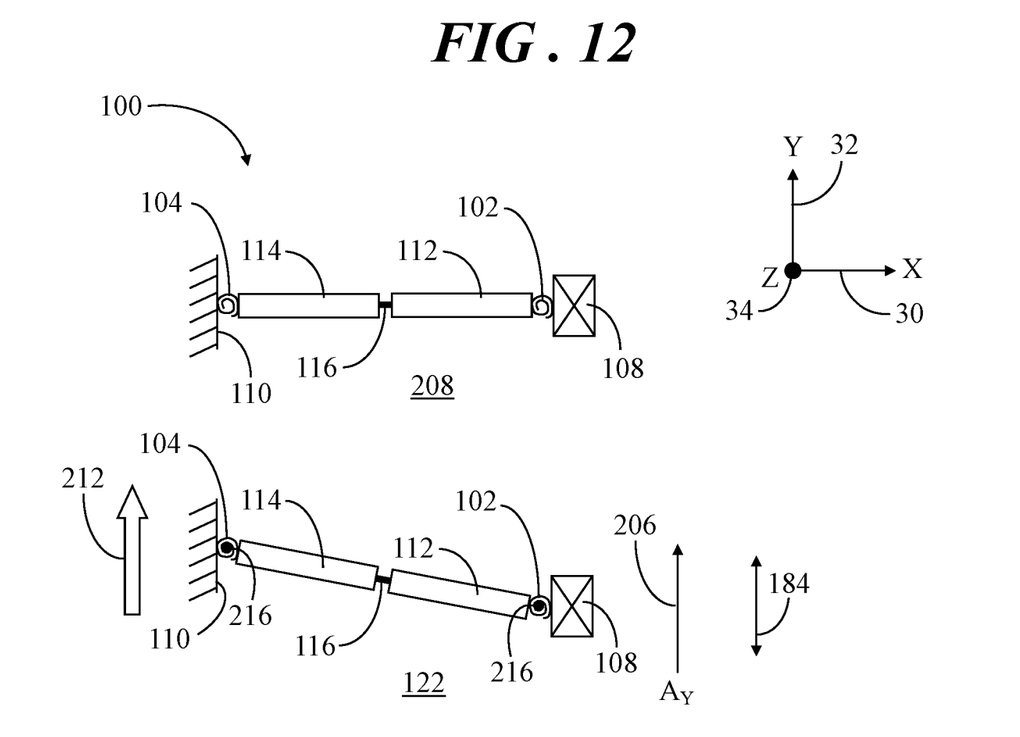
FIG. 12 shows a representative top view of the spring system of FIG. 7 in response to an acceleration force in a second direction.

FIG. 12 shows a representative top view of first spring system 100 (FIG. 7) in response to a second acceleration force 206, labeled $A_Y$, in Y-direction 184. Again, the following discussion applies equivalently to second spring system 144. FIG. 12 shows a first representative model 208 of first spring system 100 that is not being subjected to second acceleration force 206 and a second representative model 210 of first spring system 100 being subjected to second acceleration force 206 in Y-direction 184. In the images of FIG. 12, first and second end flexures 102, 108 (FIG. 7) are represented by simple torsion models and first center flexure 116 is represented by a simple beam model.

First spring system 100 is configured to facilitate translational motion, represented by an arrow 212, of proof mass 110 relative to first anchor 108 and substantially parallel to surface 146 (FIG. 9) of substrate 148 (FIG. 9) in order to sense second acceleration force 206 in Y-direction 184.

More particularly, a combined function of first and second spring systems 100, 144 (FIG. 9) enables translational motion in Y-direction 184 relative to the respective first and second anchors 108, 168 (FIG. 9) in response to second acceleration force 206. First and second end flexures 102, 104 and a beam length 214 (see FIG. 7) between first anchor 108 and proof mass 110 can provide suitable flexibility for translational motion 212 in response to second acceleration force 206 in Y-direction 184. This translational motion is therefore referred to hereinafter as Y-axis translational motion 212. As shown in second representative model 210, first and second end flexures 102, 104 enable in-plane (Z-axis) rotational flexure such that each of first and second end flexures 102, 104 rotate about an axis of rotation 216 perpendicular to surface 146 (FIG. 9) of substrate 148 (FIG. 9).

First and second beams 112, 114 do not flex significantly in response to second acceleration force 206. First center flexure 116 is compliant in X-direction 182 as discussed in connection with FIG. 11, but has a near zero bending moment. Thus, first and second beams 112, 114 and first center flexure 116 do not contribute significantly to the flexibility of first spring system 100 in response to second acceleration force 206 in Y-direction 184. Accordingly, a translational spring constant, $K_{TY}$, in Y-direction 184 is approximately proportional to the z-axis rotational stiffness, $K_{RZ}$, about axis of rotation 216 of first and second end flexures 102, 104 and inversely proportional to the square of beam length 214, LB, as follows:

$$K_{TY} \approx \frac{K_{RZ}}{L_B^2} \quad (3)$$

In one example, the spring constant, $K_{TY}$, may be approximately 8 N/m. However, alternative embodiments may implement different beam widths 218 (see FIG. 8) and more or less folds of the serpentine structure of first and second end flexures 102, 104 to yield the desired compliance in Y-direction 184.

Figure 13:
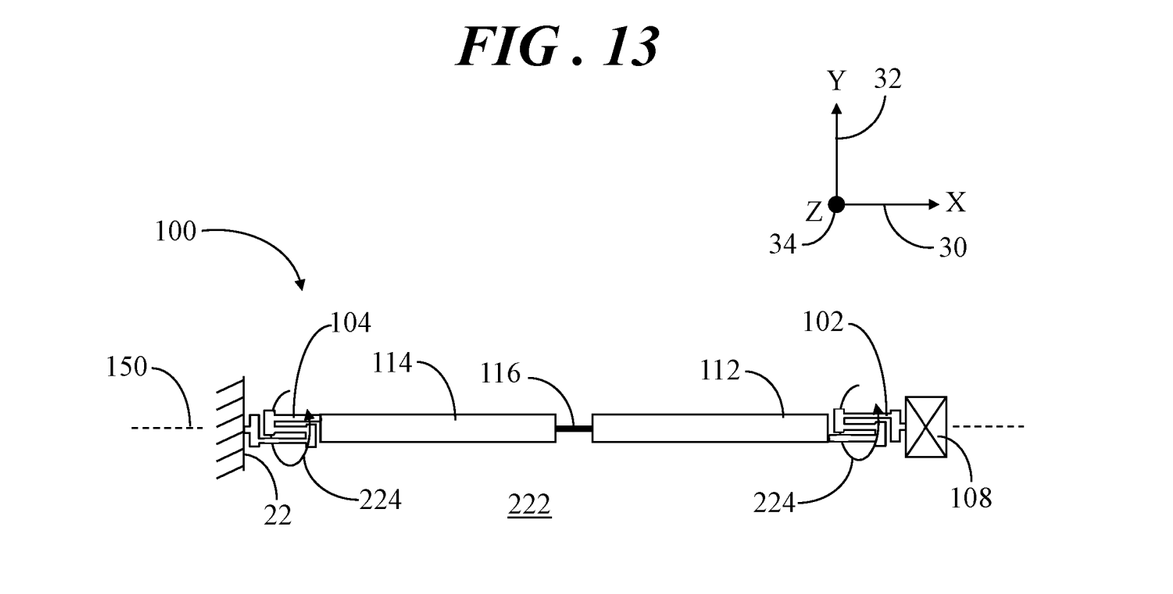
FIG. 13 shows a representative top view of the spring system of FIG. 7 in response to an acceleration force in a third direction.
Figure 14:
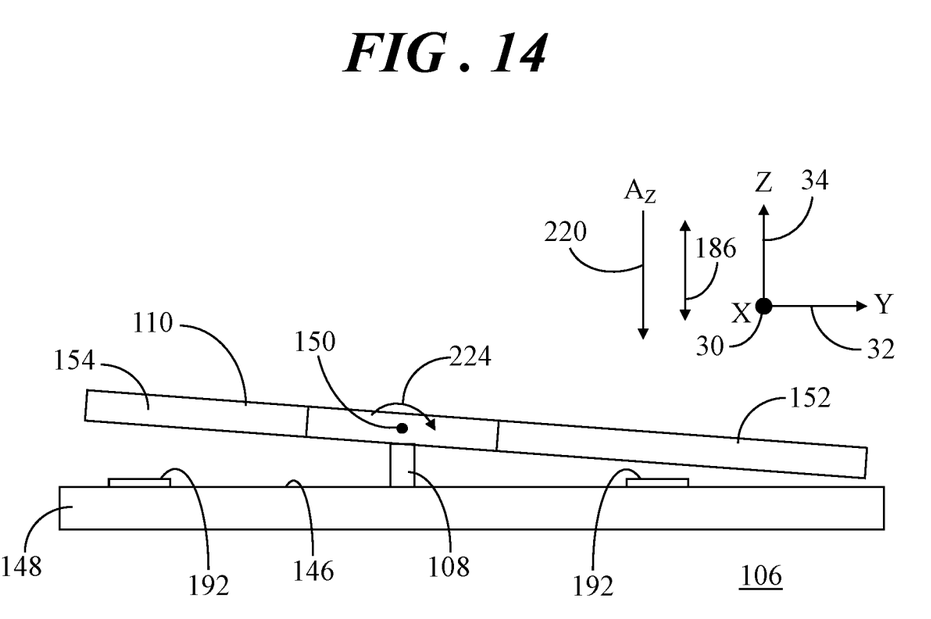
FIG. 14 shows a representative side view of the spring system of FIG. 7 in response to the acceleration force in the third direction.

Referring to FIGS. 13 and 14, FIG. 13 shows a representative top view of first spring system 100 (FIG. 7) in response to a third acceleration force and FIG. 14 shows a representative side view of inertial sensor 106 in response to a third acceleration force 220, labeled $A_Z$, in Z-direction 186. Again, the following discussion applies equivalently to second spring system 144 (FIG. 9). FIG. 13 shows a representative model 222 of first spring system 100 being subjected to third acceleration force 220 in Z-direction 1964 and FIG. 14 demonstrates the rotational motion of proof mass 110 about rotational axis 150 in response to third acceleration force 220. In the image of FIG. 13, first center flexure 116 is represented by a simple beam model.

First spring system 100 is further configured to facilitate rotational motion, represented by a curved arrow 224 in FIGS. 13 and 14, of proof mass 110 about rotational axis 150 in response to third acceleration force 220 in Z-direction 186. Torsional flexibility occurs primarily at first and second end flexures 102, 104 so that first and second end flexures 102, 104 facilitate the rotational (e.g., teeter totter) motion of proof mass 110 about rotational axis 150 in order to sense third acceleration force 220. First and second beams 112, 114 and first center flexure 116 are resistant to torsional deformation about rotational axis 150 relative to first and second end flexures 102, 104. Thus, first and second beams 112, 114 and first center flexure 116 do not contribute significantly to the flexibility of first spring system 100 in response to third acceleration force 220 in Z-direction 186. In one example, with the presence of protrusion elements 132, 134, 138, 140, an axial rotational spring constant (e.g., about rotational axis 150 aligned with X-axis 30), $K_{RX}$, may be approximately 4.1E-7 N*m per radian. However, alternative embodiments may implement less than or more than the quantity of protrusion elements 132, 134, 138, 140 to yield the desired compliance about rotational axis 150 in response to acceleration force 220 in Z-direction 186.

Accordingly, the design of protrusion elements outwardly extending from relatively narrow elongated beam flexures can provide the useful axial spring constant, $K_{RX}$, for sensing acceleration force perpendicular to a planar surface of a substrate. Further, designs can be implemented for providing the useful spring constants in each of three orthogonal directions using a single proof mass in some embodiments. The desired spring constants can be achieved while greatly increasing stiffness along the Z-axis as compared to prior art designs. The increased stiffness along the Z-axis improves linearity and restoring force. Still further, the configuration of first and second spring systems 100, 144 enables the implementation of a two spring system in lieu of prior art four spring systems, thereby achieving reductions in the area of such a MEMS inertial sensor relative to prior art designs.

Embodiments described herein entail microelectromechanical systems (MEMS) inertial sensor devices. An embodiment of a microelectromechanical systems (MEMS) device comprises a flexure spaced apart from a surface of a substrate. The flexure includes an elongated beam having a sidewall defining a longitudinal dimension of the elongated beam, and a protrusion element extending outwardly from the sidewall of the elongated beam.

Another embodiment of a MEMS device comprises a flexure spaced apart from a surface of a substrate. The flexure includes an elongated beam having first and second ends, and a sidewall defining a longitudinal dimension of the elongated beam, and a protrusion element extending outwardly from the sidewall of the elongated beam, the protrusion element being positioned along the sidewall displaced away from the first and second ends, wherein the elongated beam and the protrusion element each exhibit a thickness that is perpendicular to the surface of the substrate.

An embodiment of a MEMS inertial sensor comprises a movable element spaced apart from a surface of a substrate, an anchor attached to the substrate, and a spring system spaced apart from the surface of the substrate and configured to movably couple the movable element to the substrate. The spring system comprising a first beam, a second beam, a center flexure interposed between the first and second beams, a first end flexure interconnected between a first end of the first beam and the anchor, and a second end flexure interconnected between a second end of the second beam and an edge of the movable element. Each of the first and second end flexures comprises an elongated beam having first and second ends, and a sidewall defining a longitudinal dimension of the elongated beam. Each of the first and second end flexures further comprises a protrusion element extending outwardly from the sidewall of the elongated beam, the protrusion element being displaced away from the first and second ends of the elongated beam.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A device comprising:
a movable element spaced apart from a surface of a substrate;
an anchor attached to the substrate; and
a spring system spaced apart from the surface of the substrate and configured to movably couple the movable element to the substrate, the spring system including:
at least one beam interconnected between the movable element and the anchor; and
a flexure spaced apart from a surface of a substrate and interconnected between a first end of the at least one beam and either the anchor or an edge of the movable element, the flexure including an elongated beam having a sidewall defining a longitudinal dimension of the elongated beam and a protrusion element extending outwardly from the sidewall of the elongated beam, wherein the protrusion element is a T-shaped structure having a base and a crossmember, a first end of the base being coupled to the sidewall of the elongated beam and a central portion of the crossmember being coupled to a second end of the base, wherein the crossmember has a length that is greater than a width of the base.

2. The device of claim 1 wherein the protrusion element is a cantilevered arrangement extending from the sidewall of the elongated beam substantially parallel to the surface of the substrate.

3. The device of claim 1 wherein each of the elongated beam and the protrusion element exhibit a thickness that is perpendicular to the surface of the substrate.

4. The device of claim 3 wherein the elongated beam exhibits a beam width in a direction that is orthogonal to the longitudinal dimension and to the thickness, the beam width being less than each of the longitudinal dimension and the thickness.

5. The device of claim 1 wherein the protrusion element is a first protrusion element, and the flexure further comprises a second protrusion element extending outwardly from the sidewall of the elongated beam, the second protrusion element being laterally displaced away from the first protrusion element.

6. The device of claim 1 wherein the elongated beam has a first end and a second end, and the protrusion element is positioned along the sidewall displaced away from the first and second ends.

7. The device of claim 1 wherein:
the elongated beam comprises a serpentine flexure having a first beam segment, a second beam segment, and at least one interposing beam segment located between the first and second beam segments, the first beam segment, the at least one interposing beam segment, and the second beam segment being interconnected via connectors to form the serpentine flexure;
the sidewall of the elongated beam is a first sidewall of the first beam segment;
the protrusion element is a first protrusion element; and
the flexure further comprises a second protrusion element outwardly extending from a second sidewall of the second beam segment.

8. The device of claim 7 wherein:
the first protrusion element is positioned on the first sidewall of the first beam segment displaced away from the connectors; and
the second protrusion element is positioned on the second sidewall of the second beam segment displaced away from the connectors.

9. The device of claim 1 wherein the flexure is a first end flexure,
wherein:
the at least one beam of the spring system includes a first beam and a second beam, wherein the first end flexure is interconnected between a first end of the first beam and the anchor; and
the spring system further includes:
a center flexure interposed between the first and second beams; and
a second end flexure interconnected between a second end of the second beam and an edge of the movable element, the second end flexure including a second elongated beam and a second protrusion element extending outwardly from a second sidewall of the second elongated beam.

10. A device comprising:
a movable element spaced apart from a surface of a substrate;
an anchor attached to the substrate; and
a spring system spaced apart from the surface of the substrate and configured to movably couple the movable element to the substrate, the spring system including:
at least one beam interconnected between the movable element and the anchor; and
a flexure spaced apart from a surface of a substrate and interconnected between a first end of the at least one beam and either the anchor or an edge of the movable element, the flexure including an elongated beam having first and second ends, and a sidewall defining a longitudinal dimension of the elongated beam and a protrusion element extending outwardly from the sidewall of the elongated beam, the protrusion element being positioned along the sidewall displaced away from the first and second ends, wherein the elongated beam and the protrusion element each exhibit a thickness that is perpendicular to the surface of the substrate, and wherein the protrusion element is a T-shaped structure having a base and a crossmember, a first base end of the base being coupled to the sidewall of the elongated beam and a central portion of the crossmember being coupled to a second base end of the base, wherein the crossmember has a length that is greater than a width of the base.

11. The device of claim 10 wherein the protrusion element is a first protrusion element, and the flexure further comprises a second protrusion element extending outwardly from the sidewall of the elongated beam, the second protrusion element being laterally displaced away from the first protrusion element, and both of the first and second protrusion elements being laterally displaced away from the first and second ends of the elongated beam.

12. The device of claim 10 wherein:
the elongated beam comprises a serpentine flexure having a first beam segment, a second beam segment, and at least one interposing beam segment located between the first and second beam segments, the first beam segment, the at least one interposing beam segment, and the second beam segment being interconnected via connectors to form the serpentine flexure;
the sidewall of the elongated beam is a first sidewall of the first beam segment;
the protrusion element is a first protrusion element;
the flexure further comprises a second protrusion element outwardly extending from a second sidewall of the second beam segment;
the first protrusion element is positioned on the first sidewall of the first beam segment displaced away from the connectors; and
the second protrusion element is positioned on the second sidewall of the second beam segment displaced away from the connectors.

13. An inertial sensor comprising:
a movable element spaced apart from a surface of a substrate;
an anchor attached to the substrate; and
a spring system spaced apart from the surface of the substrate and configured to movably couple the movable element to the substrate, the spring system comprising a first beam, a second beam, a center flexure interposed between the first and second beams, a first end flexure interconnected between a first end of the first beam and the anchor, and a second end flexure interconnected between a second end of the second beam and an edge of the movable element, wherein each of the first and second end flexures comprises:
an elongated beam having first and second ends, and a sidewall defining a longitudinal dimension of the elongated beam; and
a protrusion element extending outwardly from the sidewall of the elongated beam, the protrusion element being displaced away from the first and second ends of the elongated beam, wherein the protrusion element is a T-shaped structure having a base and a crossmember, a first end of the base being coupled to the sidewall of the elongated beam and a central portion of the crossmember being coupled to a second end of the base, wherein the crossmember has a length that is greater than a width of the base.

14. The inertial sensor of claim 13 wherein the first and second end flexures having the protrusion element are configured to resist axial torsional flexion.

15. The inertial sensor of claim 13 wherein:
the movable element has a mass that is asymmetric relative to a rotational axis;
the spring system is configured to facilitate translational motion of the movable element substantially parallel to the surface of the substrate, wherein the translation motion is in a first direction parallel to a first axis in response to a first force that is parallel to the first axis and in a second direction parallel to a second axis in response to a second force that is parallel to the second axis, the first and second axes being substantially parallel to the surface of the substrate, and the second axis being substantially orthogonal to the first axis; and
the spring system is further configured to facilitate rotational motion of the movable element about the rotational axis, wherein the rotational motion is in response to a third force along a third axis that is perpendicular to the surface of the substrate, and the rotational motion of the movable element about the rotational axis comprises rotation about the first axis.

16. The inertial sensor of claim 15 wherein the first and second end flexures having the protrusion element are configured to produce in-plane flexion to enable the translational motion of the movable element in the second direction in response to the second force.

17. The inertial sensor of claim 13 wherein for each of the first and second end flexures of the spring system:
the elongated beam comprises a serpentine flexure having a first beam segment, a second beam segment, and at least one interposing beam segment located between the first and second beam segments, the first beam segment, the at least one interposing beam segment, and the second beam segment being interconnected via connectors to form the serpentine flexure;
the sidewall of the elongated beam is a first sidewall of the first beam segment;
the protrusion element is a first protrusion element; and
each of the first and second end flexures further comprises a second protrusion element outwardly extending from a second sidewall of the second beam segment.

18. The inertial sensor of claim 17 wherein:
the first protrusion element is positioned on the first sidewall of the first beam segment displaced away from the first connector; and
the second protrusion element is positioned on the second sidewall of the second beam segment displaced away from the second connector.

* * * * *